(12) United States Patent
Nowodzinski et al.

(10) Patent No.: US 10,578,661 B2
(45) Date of Patent: Mar. 3, 2020

(54) METHOD FOR DETERMINING THE QUALITY FACTOR OF AN OSCILLATOR

(71) Applicant: COMMISSARIAT A L'ENERGIE ATOMIQUE ET AUX ENERGIES ALTERNATIVES, Paris (FR)

(72) Inventors: Antoine Nowodzinski, Saint-Joseph-de-Rivière (FR); Frédéric Souchon, Saint-Alban-de-Roche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/142,802

(22) Filed: Sep. 26, 2018

(65) Prior Publication Data

US 2019/0097578 A1   Mar. 28, 2019

(30) Foreign Application Priority Data

Sep. 28, 2017 (FR) ...................................... 17 59009

(51) Int. Cl.
| | |
|---|---|
| *G01R 27/26* | (2006.01) |
| *G01R 23/16* | (2006.01) |
| *G01R 31/317* | (2006.01) |
| *G01R 23/00* | (2006.01) |
| *B81C 99/00* | (2010.01) |
| *H03B 5/30* | (2006.01) |
| *G01C 19/5656* | (2012.01) |
| *G01C 19/5684* | (2012.01) |

(52) U.S. Cl.
CPC ........ *G01R 27/2688* (2013.01); *B81C 99/003* (2013.01); *G01R 23/00* (2013.01); *G01R 23/16* (2013.01); *G01R 31/31702* (2013.01); *H03B 5/30* (2013.01); *G01C 19/5656* (2013.01); *G01C 19/5684* (2013.01)

(58) Field of Classification Search
CPC ................ G01R 27/2688; G01R 27/26; B81C 99/0035; B81C 99/005; B81C 99/0045; B81C 99/003; G01C 19/5684; G01C 19/5656; H03B 5/30; H03B 2200/0016
See application file for complete search history.

(56) References Cited

U.S. PATENT DOCUMENTS

| | | | |
|---|---|---|---|
| 8,686,802 B1 | 4/2014 | Brown et al. | |
| 10,309,782 B2 * | 6/2019 | Kapusta | ............. G01C 19/5776 |

OTHER PUBLICATIONS

Ozdemir, Savas, et al. "Measuring the Quality Factor in MEMS devices." Micromachines 6.12 (2015): 1935-1945. (Year: 2015).*

(Continued)

*Primary Examiner* — Ryan Johnson
(74) *Attorney, Agent, or Firm* — Pillsbury Winthrop Shaw Pittman LLP

(57) ABSTRACT

A method for determining a quality factor of an electrostatically actuated oscillator, the oscillator having a resonance frequency, the method including generating an excitation voltage defined as being the sum of a sinusoidal voltage and a voltage pulse; applying the excitation voltage at the input of the oscillator; acquiring in the time domain a response voltage present at the output of the oscillator after having ceased applying the excitation voltage at the input of the oscillator; determining the quality factor of the oscillator from the response voltage acquired at the output of the oscillator.

5 Claims, 4 Drawing Sheets

(56) References Cited

OTHER PUBLICATIONS

Bao, Minhang. Analysis and design principles of MEMS devices. Elsevier, 2005, pp. 92-95 (Year: 2005).*

Gregory, J. A., J. Cho, and K. Najafi. "Characterization and control of a high-Q MEMS inertial sensor using low-cost hardware." Proceedings of the 2012 IEEE/ION Position, Location and Navigation Symposium. IEEE, 2012. (Year: 2012).*

Search Report as issued in French Patent Application No. 1759009, dated Jul. 16, 2018.

Zhang, W.-M., et al., "Nonlinear Dynamic Analysis of Electrostatically Actuated Resonant MEMS Sensors Under Parametric Excitation," IEEE Sensors Journal, vol. 7, No. 3, Mar. 2007, XP011163489, p. 370-380.

Nayfeh, A. H., et al., "Dynamics of MEMS resonators under superharmonic and subharmonic excitations," Institute of Physics Publishing, Journal of Micromechanics and Microengineering, vol. 15, No. 10, Oct. 2005, XP020091372, pp. 1840-1847.

Ouakad, H. M., et al., "The dynamic behavior of MEMS arch resonators actuated electrically," International Journal of Non-Linear Mechanics, vol. 45, No. 7, Sep. 2010, XP055415795, pp. 704-713.

* cited by examiner

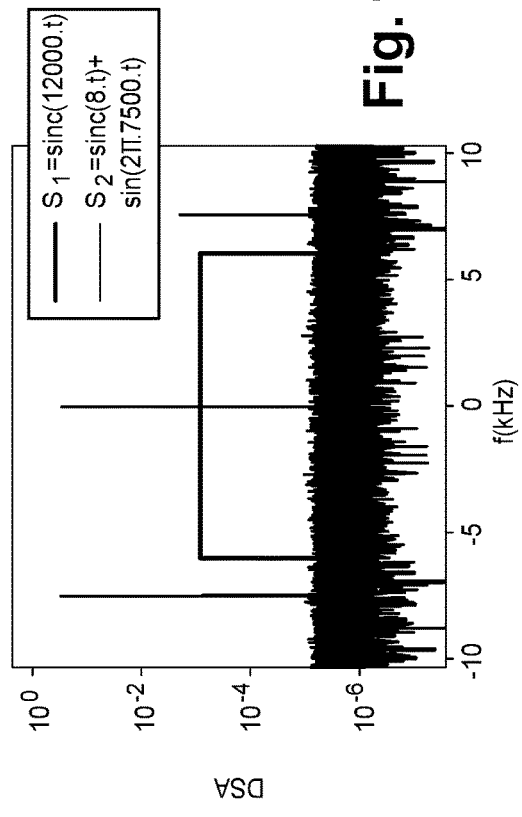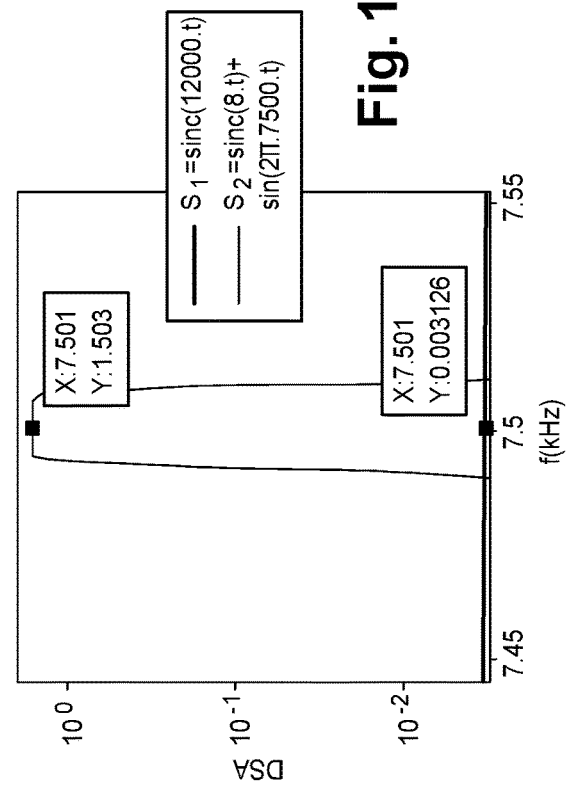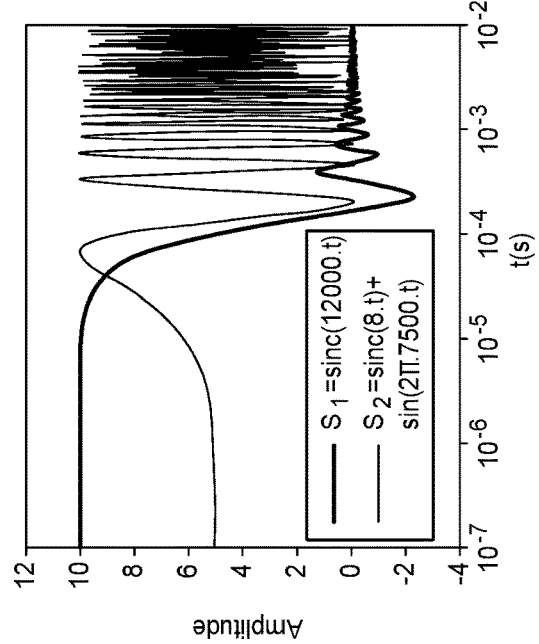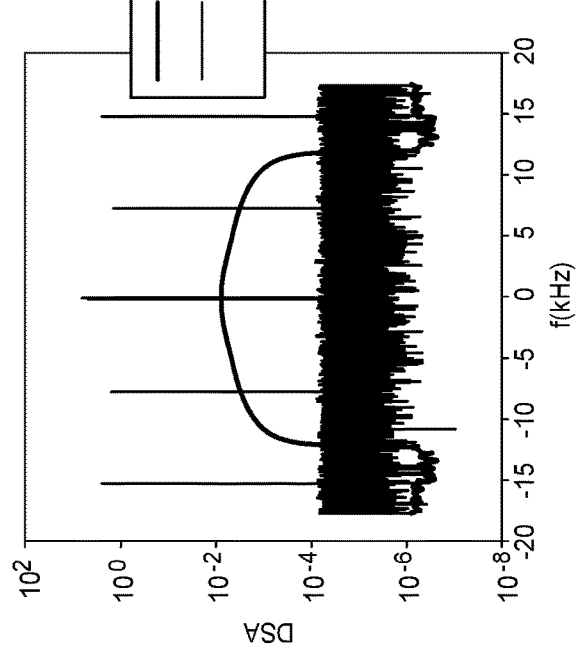

METHOD FOR DETERMINING THE QUALITY FACTOR OF AN OSCILLATOR

CROSS-REFERENCE TO RELATED APPLICATIONS

This application claims priority to French Patent Application No. 1759009, filed Sep. 28, 2017, the entire content of which is incorporated herein by reference in its entirety.

TECHNICAL FIELD OF THE INVENTION

The present invention relates to a method for determining the quality factor of an oscillator.

TECHNOLOGICAL BACKGROUND OF THE INVENTION

An electrostatically actuated oscillator of micro- or nano-electromechanical system type, respectively MEMS or NEMS, is a device including a moveable element that can be set to oscillate.

Such oscillators consume little energy and have a reduced size. They thus find particularly advantageous application in nomadic objects such as smartphones or tablet computers. These oscillators are in particular used to manufacture inertial sensors, such as accelerometers or gyroscopes, intended to equip such objects.

A nomadic objet may moreover be equipped with a global positioning system (GPS) which consumes a lot of energy. Inertial sensors make it possible to calculate in real time the movements of the object and thus to reduce resorting to the global positioning system. The latter remains however useful for determining a reference position of the object, for example at regular time intervals.

The electrostatically actuated oscillator comprises actuating means which transform an excitation signal applied at the input of the oscillator into an electrostatic actuating force, also called "excitation force", acting on the moveable element. The movements of the moveable element are measured by detection means which generate a response signal at the output of the oscillator. The excitation signal and the response signal are for example in the form of voltages.

The oscillator is notably characterised by a quality factor which is a parameter that has an influence on the precision of the inertial sensor. An oscillator with a high quality factor makes it possible to obtain a more precise inertial sensor, which makes it possible to resort less frequently to the global positioning system and thus to reduce electrical energy consumption.

It is thus important to measure the quality factor of the oscillator, notably to validate the development and the manufacture of the inertial sensor.

A first method for measuring the quality factor consists in exciting the oscillator by means of a sinusoidal excitation voltage of frequency $F_0$ and in measuring the amplitude of the oscillations at the frequency $2F_0$. The amplitude of the oscillations is measured at the frequency $2F_0$ because the actuating force is proportional to the square of the excitation voltage. By sweeping a frequency range, an amplitude spectral density of the oscillations is obtained which includes a resonance peak having an amplitude maximum reached at the resonance frequency of the oscillator. The quality factor may then be determined from the width of the resonance peak considered at half of its height.

A drawback of this measurement method by frequency sweeping is that in order to measure the amplitude of the oscillations correctly, the oscillator has to recover an idle position between two successive measurements. The time necessary for the oscillator to recover its idle position after excitation is approximately equal to three times a damping constant which is proportional to the quality factor. Considering for example a quality factor of the order of $10^6$, the damping constant is of the order of 10 seconds. In this case, for example more than 2 hours are needed to acquire 250 measurement points.

Furthermore, the precision with which the resonance peak is defined depends on the number of measurement points. If the number of points is not sufficient, the resonance peak may be widened artificially and its amplitude maximum may be frequency shifted, which distorts the measurement of the quality factor.

The time necessary to implement this measurement method is thus a factor limiting productivity, all the more since the current trend is to increase the quality factor of oscillators. This measurement time does not make it reasonably possible, in particular from an industrial viewpoint, to characterise all of the oscillators of a silicon wafer, which generally comprises more than one hundred thereof. Only several oscillators are then characterised, which makes it difficult to estimate a manufacturing efficiency of the oscillators.

The quality factor may also be determined by measuring the logarithmic decrement of the amplitude of the oscillations of the oscillator. This measurement method consists in applying an excitation signal at the input of the oscillator then in acquiring the response signal present at the output of the oscillator after having stopped the excitation of the oscillator.

The measurement of the logarithmic decrement may be carried out using as excitation signal a sinusoidal voltage at the resonance frequency. In this case, a drawback is that it is necessary to parameterise the frequency of the sinusoidal voltage with precision. Indeed, if the frequency of the sinusoidal voltage deviates too far from the resonance frequency, the amplitude of the oscillations risks being too low to enable a correct measurement.

FIG. 1 illustrates the relationship that exists between the quality factor and the precision required to adjust the frequency of the excitation signal. FIG. 1 represents the amplitude spectral density (ASD) of the response voltage of three oscillators of which the resonance frequency is equal to 85 kHz and of which the quality factor Q is respectively equal to $10^4$, $10^5$ and $10^6$. The spectral width $\Delta F$ of the resonance peak when the amplitude is divided by a factor 10 with respect to the amplitude maximum is considered. This spectral width $\Delta F$, which represents the tolerance on the value that the frequency of the excitation signal can take, is equal to around 400, respectively 40 and 4, parts per million of the resonance frequency when the quality factor is equal to $10^4$, respectively $10^5$ and $10^6$.

Another drawback is that the resonance frequency of the oscillator varies as a function of the experimental conditions, notably as a function of the temperature and the mounting for the measurement. The variation in the resonance frequency can reach 5000 parts per million. Consequently, it is necessary to search for the resonance frequency before each measurement of the quality factor, which wastes a lot of time. In addition, when the resonance frequency of the oscillator varies rapidly, it may be difficult to string together sufficiently rapidly the localisation of the resonance frequency and the measurement of the logarithmic decrement.

The measurement of the logarithmic decrement may also be carried out using as excitation signal a voltage pulse. Indeed, a pulse in the time domain corresponds to a constant amplitude in the frequency domain. In practice, the pulse rather has a wide spectral band width. By ensuring that the resonance frequency of the oscillator is included in the spectral width of the pulse, it is possible to excite the oscillator without it being necessary to know precisely the resonance frequency.

However, a drawback of this method is that the higher the resonance frequency of the oscillator, the lower the amplitude spectral density of the excitation signal because the spectral width of the excitation signal must be greater than the resonance frequency. This phenomenon is highlighted in FIGS. 2A and 2B.

FIG. 2A shows an example of a voltage pulse in the form of a cardinal sine function, the voltage pulse u(t) being defined by the following equation:

$$u(t)=A \cdot \sin c(\Delta F \cdot t) \quad (1)$$

where A and ΔF are respectively the amplitude and the spectral band width of the excitation signal. FIG. 2 represents a first signal having a first spectral width $\Delta F_1$ of 100 Hz and a second signal having a second spectral width $\Delta F_2$ of 10 Hz.

FIG. 2B shows the amplitude spectral density of the signals of FIG. 2A. When the spectral width is multiplied by a factor 10, the amplitude spectral density is divided by a factor 10. Consequently, if the resonance frequency of the oscillator is high, for example of the order of several tens of kilohertz, the electrostatic force generated by the voltage pulse is too weak to excite the oscillator so as to enable a measurement of the amplitude of the oscillations.

SUMMARY OF THE INVENTION

In light of the above there exists a need to have available a method that is both rapid and reliable for determining the quality factor of an electrostatically actuated oscillator.

To meet this need, a first aspect of the invention relates to a method for determining a quality factor of an electrostatically actuated oscillator, the oscillator having a resonance frequency, the method comprising the following steps:
 generating an excitation voltage defined as being the sum of a sinusoidal voltage and a voltage pulse;
 applying the excitation voltage at the input of the oscillator;
 acquiring in the time domain a response voltage present at the output of the oscillator after having ceased applying the excitation voltage at the input of the oscillator;
 determining the quality factor of the oscillator from the response voltage acquired at the output of the oscillator.

The invention makes it possible to determine the quality factor of the oscillator rapidly by making a single acquisition of the response signal, this acquisition lasting several seconds. In addition, the use of the sum of a sinusoidal voltage and a voltage pulse to excite the oscillator makes it possible to get away from a potential drift of the resonance frequency while generating sufficient electrostatic actuating force to make the oscillator resonate. In this case, it is not necessary to know precisely the resonance frequency of the oscillator.

According to one embodiment, the step of determining the quality factor comprises the following operations:
 obtaining, by transformation in the frequency domain, an amplitude spectral density of the response voltage, the amplitude spectral density having a resonance peak;
 filtering the amplitude spectral density around the resonance frequency;
 carrying out an inverse transformation of the filtered amplitude spectral density so as to obtain a filtered response voltage in the time domain;
 determining the quality factor of the oscillator by measuring the logarithmic decrement of the amplitude of the oscillations of the filtered response voltage.

According to one embodiment, the step of determining the quality factor comprises the following operations:
 obtaining, by transformation in the frequency domain, an amplitude spectral density of the response voltage, the amplitude spectral density having a resonance peak;
 determining the quality factor of the oscillator by calculating the ratio between the resonance frequency and the width of the resonance peak considered at half of its height.

According to one embodiment, the method comprises a prior step of estimating the resonance frequency of the oscillator, the sinusoidal voltage having a frequency equal to the estimated resonance frequency.

According to one embodiment, the voltage pulse is a pulse response of a low-pass filter.

According to one embodiment, the voltage pulse is in the form of a cardinal sine function.

A second aspect of the invention relates to a computer programme product including instructions for the implementation of the method according to the first aspect of the invention, when these instructions are executed by a processor.

BRIEF DESCRIPTION OF THE FIGURES

The invention and the different applications thereof will be better understood on reading the description that follows and by examining the figures that accompany it, among which:

FIG. 9 represents two excitation voltages used to measure the quality factor of an oscillator, respectively according to the prior art and according to the invention;

FIG. 10 represents the amplitude spectral density of the excitation voltages of FIG. 9;

FIG. 11A represents the amplitude spectral density of the excitation forces generated by the excitation voltages of FIG. 9;

FIG. 11B is an enlarged view of FIG. 11A around the resonance frequency;

Figure 1:
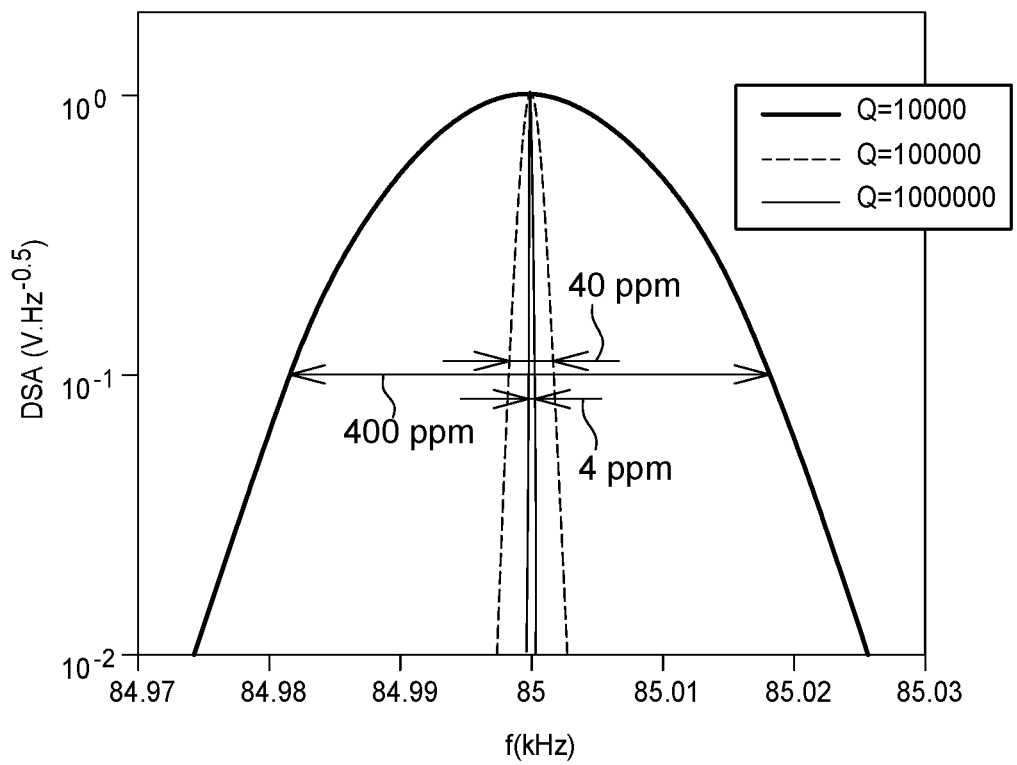
FIG. 1 represents the amplitude spectral density of the response voltage present at the output of three oscillators having a quality factor respectively equal to $10^4$, $10^5$ and $10^6$.
Figure 2A:
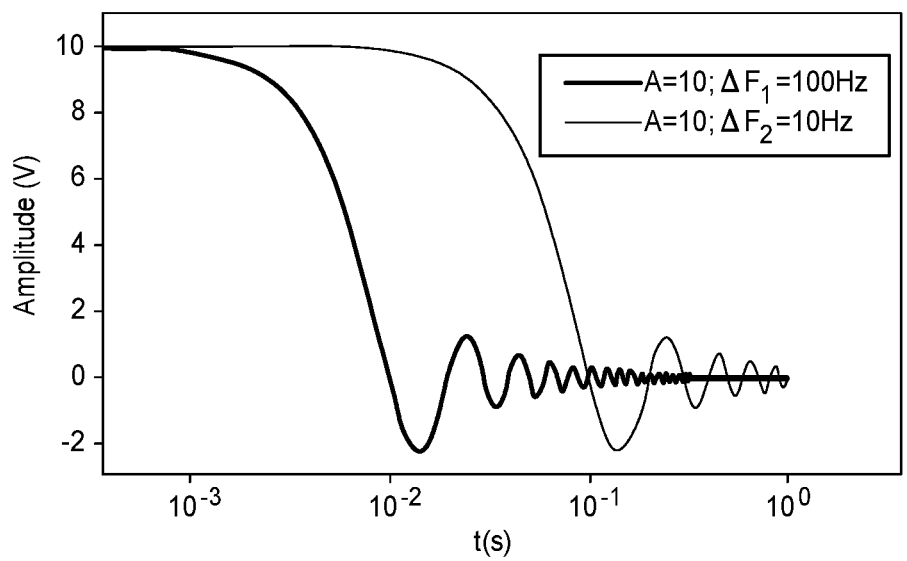
FIG. 2A represents the variation in amplitude as a function of time of two voltage pulses having a spectral width respectively equal to 100 Hz and 10 Hz.
Figure 2B:
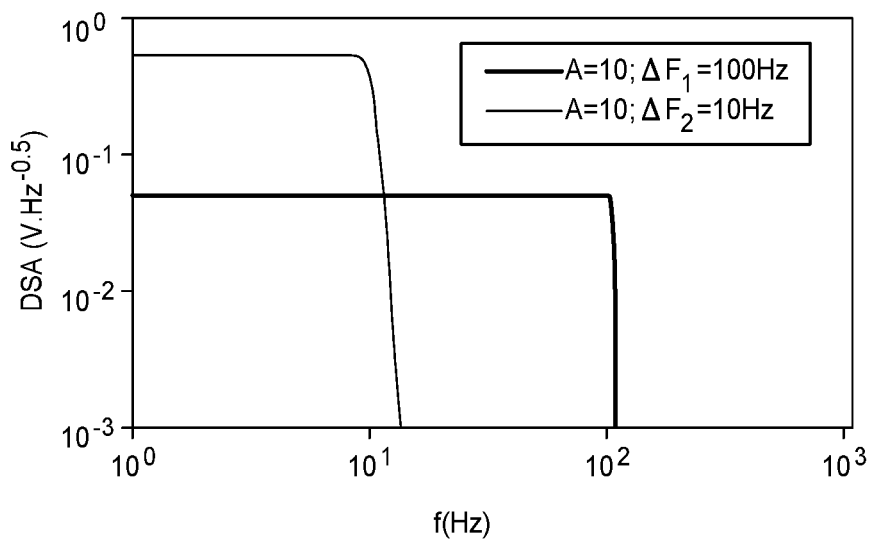
FIG. 2B represents the amplitude spectral density of the voltage pulses of FIG. 2A.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

A MEMS or NEMS type oscillator comprises a fixed part and a moveable element with respect to the fixed part. The oscillator also comprises an input and an output between which is arranged the moveable element.

The input of the oscillator is provided with electrostatic actuating means configured to make the moveable element vibrate. The actuating means transform an input electrical signal, also called "excitation signal", applied at the input of the oscillator into an electrostatic actuating force, also called "excitation force", acting on the moveable element. The excitation signal is for example in the form of a voltage. The excitation force leads to oscillatory movements of the moveable element. The actuating means include for example a first fixed electrode belonging to the fixed part and a first moveable electrode belonging to the moveable element. These electrodes may each have the shape of a comb and form together an interdigitated capacitive comb structure.

The output of the oscillator is provided with means for detecting movements of the moveable element. The detection means are configured to deliver an output electrical signal, also called "response signal", which depends on the detected movements of the moveable element. For example, the detection means are of capacitive type and comprise means for measuring capacitance between a second fixed electrode belonging to the fixed part and a second moveable electrode belonging to the moveable element. These electrodes may each have the shape of a comb and form together an interdigitated capacitive comb structure.

The oscillator is characterised by a resonance frequency and a quality factor. These two parameters are essential for validating the design of the oscillator and for its integration in a device such as an inertial sensor, for example an accelerometer or a gyroscope.

When the oscillator is excited at the resonance frequency, the amplitude of the oscillations of the moveable element is maximal. When the excitation signal is no longer applied, the oscillations of the moveable element are dampened until the moveable element recovers an idle position in which the moveable element ceases to move. The dampening over time t of the oscillations depends on an exponential term $$e^{-\frac{t}{2\tau}}$$

where $\tau$ is a damping constant, or relaxation time, defining the speed with which the amplitude of the oscillations decreases after excitation.

The quality factor Q of the oscillator is defined by the following relationship:

$$Q = \pi \cdot F_R \cdot \tau$$

where $F_R$ is the resonance frequency of the oscillator. The quality factor translates notably the precision of the sensor in which the oscillator is integrated. The higher the quality factor, the greater also the precision.

The aim of the present invention is to propose a method for determining the quality factor of the oscillator, said method being both rapid and reliable.

A preferential embodiment of the method according to the invention will now be described, with reference to FIGS. 5 to 8. The method comprises a step of generating an excitation voltage. The excitation voltage is for example supplied by a signal generator electrically connected to the input of the oscillator. According to this preferential embodiment, the excitation voltage is the sum of a sinusoidal voltage of constant frequency $F_0$ and a finite pulse response of a low-pass filter. The pulse response preferably has the shape of a cardinal sine function of spectral width $\Delta F$, the excitation voltage u(t) then being able to be defined by the following equation:

$$u(t) = A \cdot \sin c(\Delta F \cdot t) + B \cdot \sin(2 \cdot \pi \cdot F_0 \cdot t) \quad (2)$$

where A and B are the amplitude of the cardinal sine and the sinusoidal voltage respectively.

Alternatively, the pulse response may be that of any type of low-pass filter such as a Hamming, Hanning, Tchebychev, Bartlett, or Blackman window.

Figure 3:
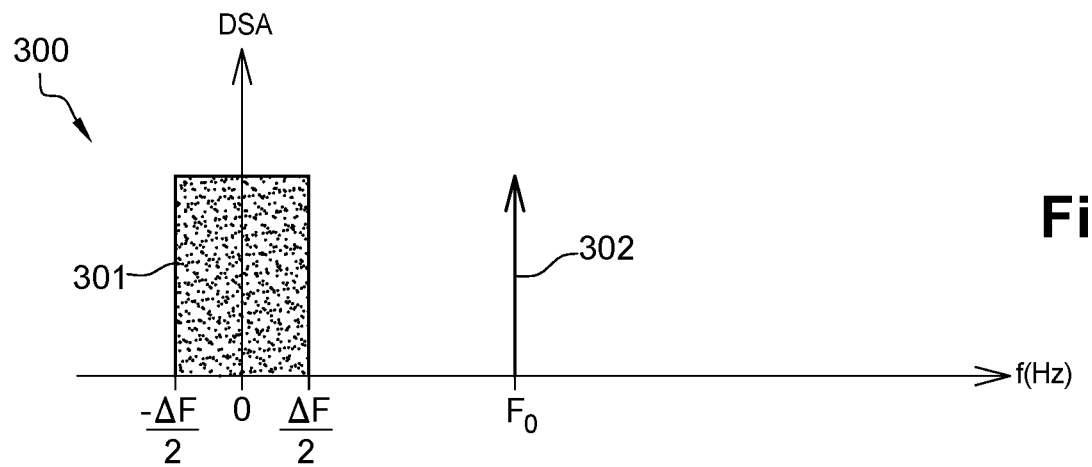
FIG. 3 represents the amplitude spectral density of an excitation voltage applied at the input of an oscillator, according to one preferential embodiment of the method of the invention.

FIG. 3 schematically represents the amplitude spectral density 300 of the excitation voltage u(t), for example calculated by means of a Fourier transform. An amplitude spectral density is expressed in units per root hertz, that is to say in volts per root hertz ($V \cdot Hz^{-0.5}$) when it is the amplitude spectral density of an excitation voltage, and in Newtons per root hertz ($N \cdot Hz^{-0.5}$) when it is the amplitude spectral density of an excitation force.

The amplitude spectral density 300 of the excitation voltage comprises:
- a first component 301 corresponding to the spectral density of the cardinal sine, the first component 301 being a rectangular function centred on 0 Hz and of spectral width $\Delta F$;
- a second component 302 corresponding to the spectral density of the sinusoidal voltage, the second component 302 being a Dirac peak situated at the frequency $F_0$.

The excitation voltage is applied at the input of the oscillator to make it oscillate. The excitation force that results therefrom is proportional to the square of the excitation voltage. The excitation force F(t) may thus be expressed by the following equation:

$$F(t) = k \left[ A^2 \cdot \text{sinc}^2(\Delta F \cdot t) + \frac{B^2}{2} - \frac{B^2}{2} \cdot \cos(4 \cdot \pi \cdot F_0 \cdot t) + 2 \cdot A \cdot B \cdot \text{sinc}(\Delta F \cdot t) \cdot \sin(2 \cdot \pi \cdot F_0 \cdot t) \right] \quad (3)$$

where k is a proportionality coefficient. The excitation force is thus the sum of a first term proportional to the square of the cardinal sine, a second term equal to a constant, a third term proportional to a sinusoidal function of frequency $2F_0$, and a fourth term proportional to the cardinal sine modulated at the frequency $F_0$.

Figure 4:
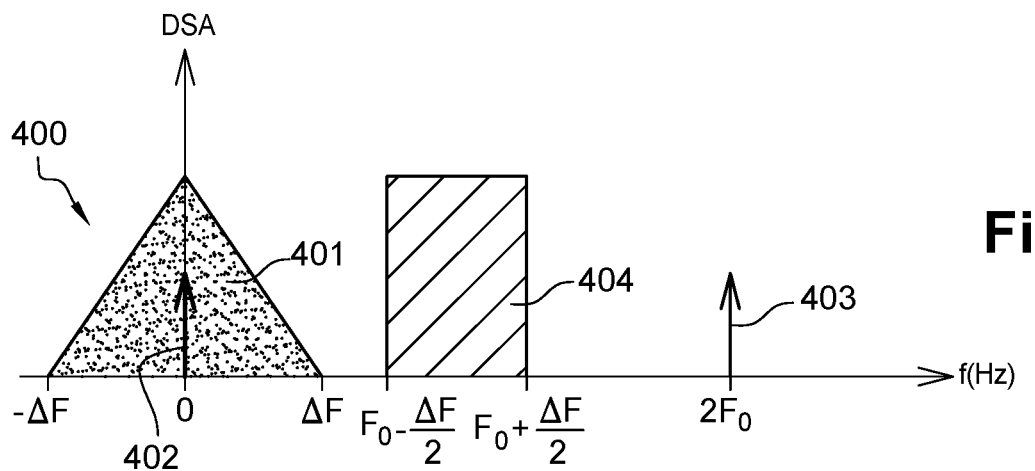
FIG. 4 represents the amplitude spectral density of the excitation force produced by the excitation voltage of FIG. 3.

FIG. 4 schematically represents the amplitude spectral density 400 of the excitation force F(t) obtained by transformation in the frequency domain, for example by means of a Fourier transform. The amplitude spectral density 400 includes:
- a first component 401 corresponding to the amplitude spectral density of the first term of the equation (3), the first component 401 having a triangular shape centred on 0 Hz and of spectral width 2ΔF;
- a second component 402 corresponding to the amplitude spectral density of the second term of the equation (3), the second component 402 being a Dirac peak situated at 0 Hz;
- a third component 403 corresponding to the amplitude spectral density of the third term of the equation (3), the third component 403 being a Dirac peak situated at the frequency $2F_0$;
- a fourth component 404 corresponding to the amplitude spectral density of the fourth term of the equation (3), the fourth component 404 being a rectangular function centred on the frequency $F_0$ and of spectral width ΔF.

The spectral width ΔF of the cardinal sine and the frequency $F_0$ of the sinusoidal voltage are parameterised so that the fourth component 404 of the excitation force F(t) extends over a frequency range including the resonance frequency of the oscillator. In other words, the spectral width ΔF of the cardinal sine and the frequency $F_0$ of the sinusoidal voltage are linked by the following relationship:

$$F_0 - \frac{\Delta F}{2} \leq F_R \leq F_0 + \frac{\Delta F}{2}$$

The excitation voltage is applied at the input of the oscillator for a sufficient duration to describe the voltage pulse. In the case for example where the voltage pulse is a cardinal sine, this duration is at least equal to 2/ΔF so as to define at least the first lobe of the cardinal sine function.

The electrical power supply of the oscillator is then cut. The excitation of the oscillator is stopped. Once the excitation voltage has ceased being applied at the input of the oscillator, a step of acquisition in the time domain of the response signal of the oscillator supplied is carried out by the detection means. To do so, acquisition means are electrically connected to the output of the oscillator. The acquisition means may be an electronic acquisition card or a digital oscilloscope. The response signal is for example in the form of a voltage.

The acquisition is carried out with a sampling frequency configured to respect the Shannon criterion. The sampling frequency here depends on the frequency $F_0$ of the sinusoidal voltage and the spectral width ΔF of the pulse response, the sampling frequency $F_e$ having to respect the following inequality:

$$F_e \geq 2 \cdot \left(F_0 + \frac{\Delta F}{2}\right)$$

Figure 5:
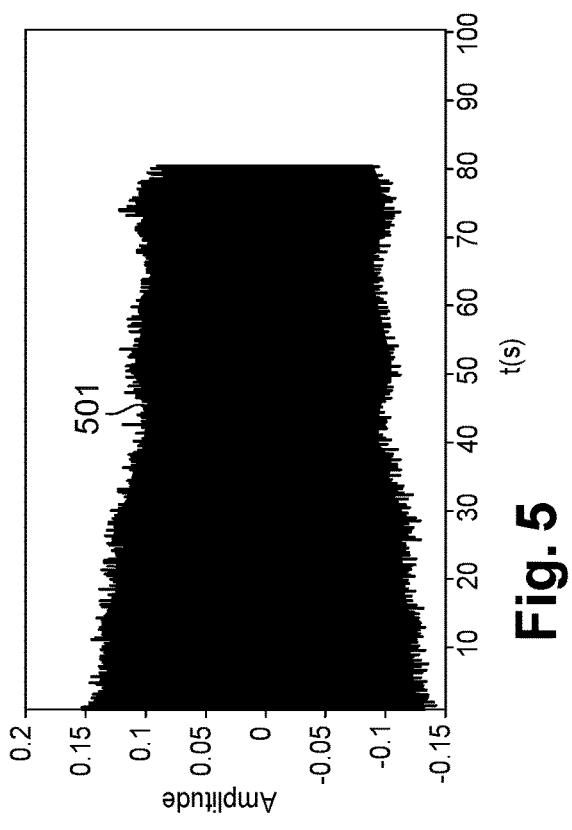
FIG. 5 represents an example of response voltage of an oscillator acquired by means of the method of the invention.

FIG. 5 shows an example of the response voltage 501 acquired at the output of an oscillator of which the resonance frequency is known and is approximately equal to 7.5 kHz. In this example, the frequency $F_0$ of the sinusoidal voltage is thus fixed at 7.5 kHz and the spectral width ΔF of the cardinal sine is adjusted to 8 Hz.

Figure 6:
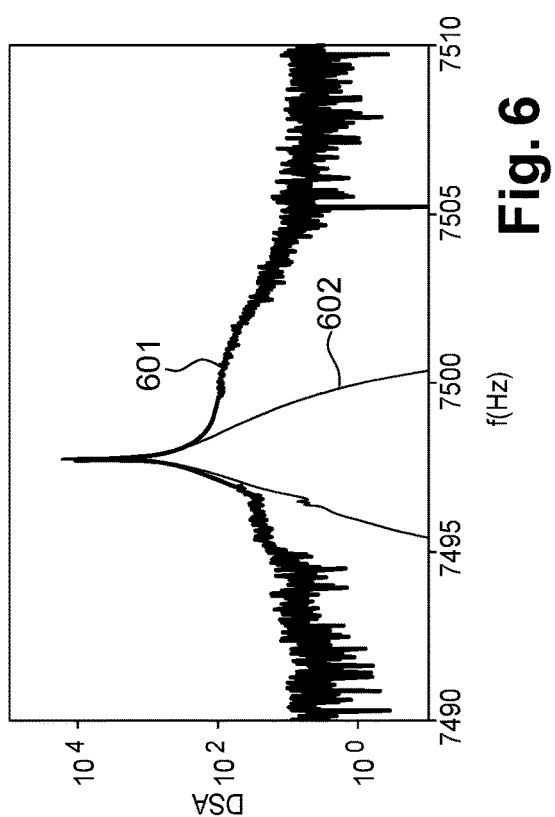
FIG. 6 represents the amplitude spectral density of the response voltage of FIG. 5, not filtered and filtered around the resonance.

The quality factor of the oscillator may be determined from the response voltage 501 thereby acquired, for example by measuring the logarithmic decrement of the amplitude of the oscillations of the response voltage 501. It involves in other words measuring the speed with which the amplitude of the oscillations decreases. To do so, the response voltage 501 is preferably transformed in the frequency domain to obtain its amplitude spectral density 601, as illustrated in FIG. 6. The amplitude spectral density 601 of the response voltage 501 is for example calculated by means of a Fourier transform.

The response voltage 501 being affected by noise, a step of filtering the amplitude spectral density 601 around the resonance frequency is advantageously carried out so as to obtain a filtered amplitude spectral density 602. The filtering step is for example carried out by means of a digital filter.

Figure 7:
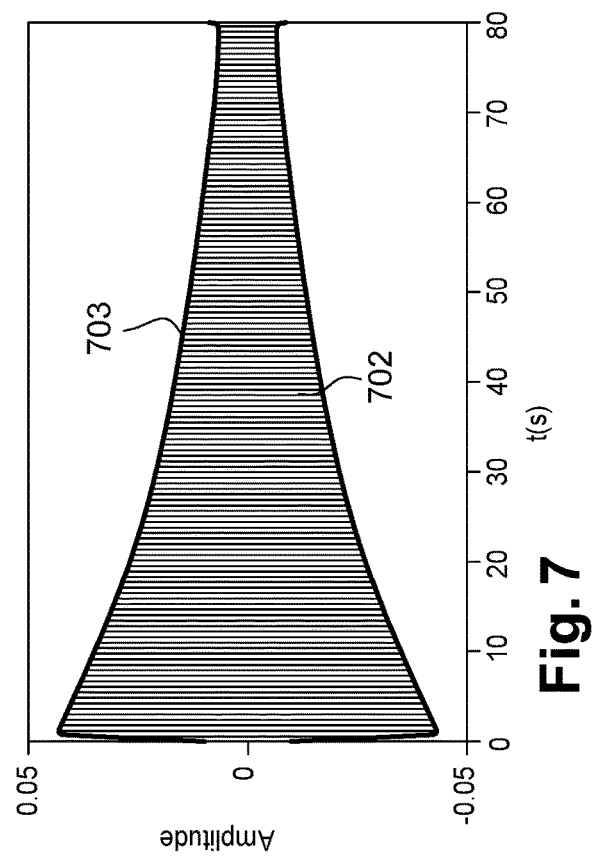
FIG. 7 represents the inverse transform of the filtered amplitude spectral density of FIG. 6.

An inverse transform of the filtered amplitude spectral density 602 may next be carried out to return to the time domain and to obtain a filtered response voltage 702, as illustrated in FIG. 7. The amplitude of the oscillations of the filtered response voltage 702 decreases with time as a function of the exponential term $$e^{-\frac{t}{2\tau}}.$$

The oscillations form an envelope 703 of the filtered response voltage 702.

Figure 8:
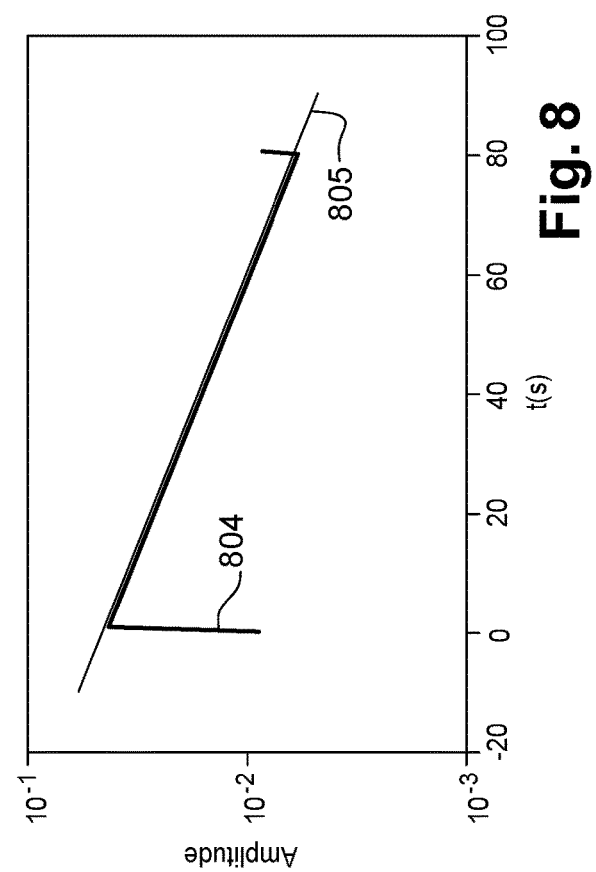
FIG. 8 represents the logarithmic decrement of the amplitude of the oscillations of the signal of FIG. 7.

FIG. 8 shows a first curve 804 representing the logarithmic decrement of the amplitude of the oscillations in a semi-logarithmic reference frame. The first curve 804 is for example obtained by carrying out a detection of amplitude on the filtered response voltage 702. FIG. 8 also shows a second curve 805 which represents an approximation of the logarithmic decrement from which the damping constant τ is determined. Knowing the resonance frequency of the oscillator, the quality factor may be calculated from the relationship linking the quality factor to the damping constant. In this example, the damping constant τ is approximately equal to 40.4 s and the quality factor Q is approximately equal to 951903.

Thanks to the invention, it is not necessary to know precisely the resonance frequency of the oscillator. By parameterising in an appropriate manner the frequency $F_0$ of the sinusoidal voltage and the spectral width ΔF of the cardinal sine, it is possible to compensate a drift of the resonance frequency of the oscillator while having sufficient amplitude spectral density so that the oscillations are distinguished from noise and thereby make it possible to measure the logarithmic decrement.

According to another embodiment, the quality factor is determined by calculating, from the amplitude spectral density 601 of the response voltage 501, the ratio of the resonance frequency over the width of the resonance peak considered at half of its height.

FIGS. 9 to 11B illustrate a comparison between the use of a first excitation voltage $S_1$ according to the prior art and the use of a second excitation voltage $S_2$ according to the invention.

FIG. 9 shows the temporal representation of the excitation voltages $S_1$ and $S_2$. The first excitation voltage $S_1$ is in the form of a voltage pulse, such as a cardinal sine function, and is parameterised so as to maximise the excitation force at the resonance frequency of the oscillator, for example equal to 7.5 kHz. The voltage pulse $S_1$ is thus defined by the following equation:

$$S_1(t) = \sin c(12000 \cdot t) \quad (4)$$

The second excitation voltage $S_2$ is that used in the exemplary embodiment described with reference to FIGS. 5 to 8. The second excitation voltage $S_2$ is thus defined by the following equation:

$$S_2(t) = \sin c(8 \cdot t) + \sin(2\pi \cdot 7500 \cdot t) \quad (5)$$

The excitation voltages $S_1$ and $S_2$ have a maximum amplitude normed at 10 V so as to be representative of a generator of signals delivering a maximum voltage limited to 10 V.

FIG. 10 represents the amplitude spectral density of the excitation voltages $S_1$ and $S_2$. The amplitude spectral density of the voltage pulse $S_1$ is a rectangular function centred on 0 Hz and having a spectral width of 12 kHz. The amplitude spectral density of the second excitation voltage $S_2$ comprises a rectangular function centred on 0 Hz and having a spectral width of 8 Hz, and a Dirac peak corresponding to the sinusoidal voltage and situated at 7.5 kHz.

FIG. 11A represents the amplitude spectral density of the excitation forces generated by the excitation voltages $S_1$ and $S_2$. The amplitude spectral density of the excitation force generated by the first excitation voltage has a triangular shape centred on 0 Hz and having a spectral width of 24 kHz. The amplitude spectral density of the excitation force generated by the second excitation voltage $S_2$ comprises a triangular shape centred on 0 Hz and having a spectral width of 24 kHz.

FIG. 11B is an enlargement of FIG. 11A centred around the frequency $F_0$ of the second excitation voltage $S_2$, which corresponds approximately to the resonance frequency of the oscillator. Around the resonance frequency, the electrostatic force generated by the second excitation voltage $S_2$ is around 1000 times higher than the electrostatic force generated by the first excitation voltage $S_1$. Furthermore, it may also be noted that the parameterisation of the frequency $F_0$ of the second excitation voltage $S_2$ is around 1000 times more tolerant than in the case of a sinusoidal excitation voltage used in the prior art. For the prior art, it would be necessary to adjust the frequency with a precision of around $8 \cdot 10^{-3}$ Hz $$\left( \frac{F_R}{Q} \approx \frac{7 \cdot 5 \cdot 10^3}{9 \cdot 5 \cdot 10^5} \right)$$

whereas in this example, the excitation force is constant over a range of 8 Hz around the resonance frequency.

The method according to the invention is for example implemented through an application. An application designates a computer programme including instructions that can be executed by a processor.

Naturally, the invention is not limited to the embodiments described with reference to the figures and alternatives could be envisaged without going beyond the scope of the invention.

The invention claimed is:

1. A method for determining a quality factor of an electrostatically actuated oscillator, the oscillator having a resonance frequency, the method comprising:
   estimating the resonance frequency of the oscillator;
   generating an excitation voltage defined as being a sum of a sinusoidal voltage having a constant frequency equal to the estimated resonance frequency and a pulse response of a low-pass filter;
   applying the excitation voltage at an input of the oscillator;
   acquiring in the time domain a response voltage present at an output of the oscillator after having ceased applying the excitation voltage at the input of the oscillator;
   determining the quality factor of the oscillator from the response voltage acquired at the output of the oscillator.

2. The method according to the claim 1, wherein determining the quality factor comprises the following operations:
   obtaining, by transformation in the frequency domain, an amplitude spectral density of the response voltage, the amplitude spectral density having a resonance peak;
   filtering the amplitude spectral density around the resonance frequency;
   carrying out an inverse transformation of the filtered amplitude spectral density so as to obtain a filtered response voltage in the time domain;
   determining the quality factor of the oscillator by measuring the logarithmic decrement of the amplitude of the oscillations of the filtered response voltage.

3. The method according to the claim 1, wherein determining the quality factor comprises the following operations:
   obtaining, by transformation in the frequency domain, an amplitude spectral density of the response voltage, the amplitude spectral density having a resonance peak;
   determining the quality factor of the oscillator by calculating the ratio between the resonance frequency and the width of the resonance peak considered at half of its height.

4. The method according to claim 3, wherein the pulse response of a low-pass filter is in the form of a cardinal sine function.

5. A non-transitory computer readable medium including instructions for the implementation of a method according to claim 1, when these instructions are executed by a processor.

* * * * *